(12) United States Patent
Higuchi

(10) Patent No.: US 6,657,904 B2
(45) Date of Patent: Dec. 2, 2003

(54) SEMICONDUCTOR DEVICE

(75) Inventor: Tsuyoshi Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 74 days.

(21) Appl. No.: 10/046,308

(22) Filed: Jan. 16, 2002

(65) Prior Publication Data
US 2002/0097610 A1 Jul. 25, 2002

(30) Foreign Application Priority Data
Feb. 19, 2001 (JP) ........................................ 2001-041823

(51) Int. Cl.$^7$ ................................................. G11C 7/00
(52) U.S. Cl. .................. 365/189.09; 365/230.06; 365/201; 365/226; 365/189.01
(58) Field of Search ................. 365/189.09, 230.06, 365/201, 226, 189.01

(56) References Cited

U.S. PATENT DOCUMENTS

| | | | | |
|---|---|---|---|---|
| 6,038,183 A | * | 3/2000 | Tsukude | 365/201 |
| 6,049,495 A | * | 4/2000 | Hsu et al. | 365/203 |
| 6,414,890 B2 | * | 7/2002 | Arimoto et al. | 365/201 |

* cited by examiner

*Primary Examiner*—Richard Elms
*Assistant Examiner*—Nam Nguyen

(57) ABSTRACT

A semiconductor device including a voltage generator which sets a voltage of a non-selected word line to a negative voltage produced by the voltage generator when the semiconductor device is set in a normal mode. A circuit resets the voltage of the non-selected word line to a ground voltage when the semiconductor device is set in a predetermined mode.

10 Claims, 7 Drawing Sheets

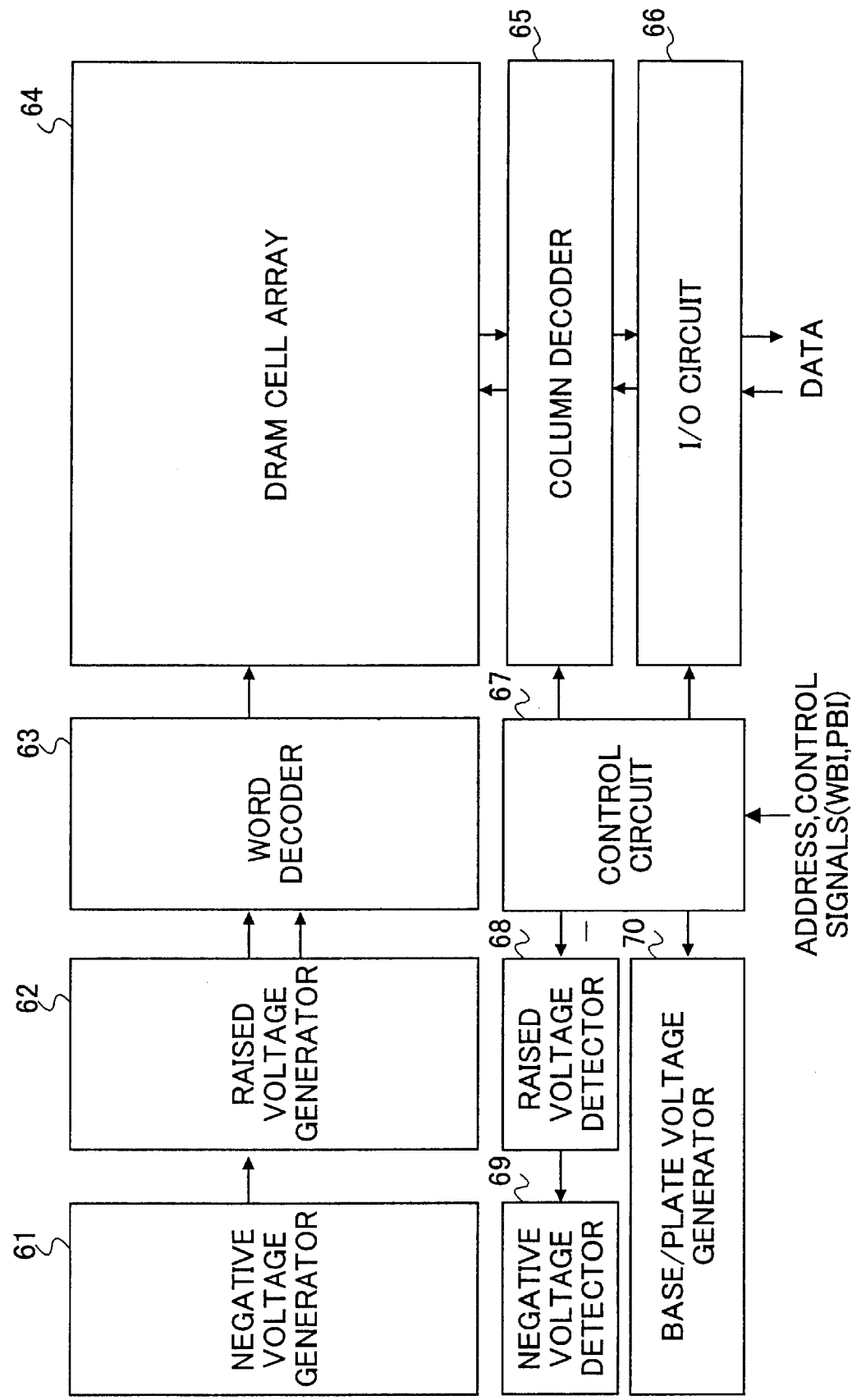

SEMICONDUCTOR DEVICE

BACKGROUND OF THE INVENTION

1. Field of the Invention

The present invention generally relates to a semiconductor device, and more particularly to a semiconductor memory device, such as DRAM, which is subjected to a screening test.

2. Description of the Related Art

A screening test (also called an accelerated aging test) is conducted for semiconductor memory devices, such as DRAM, before the IC chips are built into in the packages, in order to eliminate the devices that yield early failures among the manufactured products. When the screening test is conducted, a raised power-source voltage, equivalent to or higher than the rated voltage, is applied to the semiconductor device to be tested under a high-temperature condition. Further, the internally produced voltage of the semiconductor device being tested is increased to a level higher than the level in the normal mode operation. During the screening test, the semiconductor device being tested suffers such voltage and temperature stresses.

If the power-source voltage and the internally produced voltage are too high, a breakdown of the semiconductor device occurs during the screening test. If the power-source voltage and the internally produced voltage are too low, the time needed to finish the screening test becomes long and the cost becomes high. Hence, it is necessary to generate these voltages at proper levels in the screening test. In particular, the internally produced voltage must be set to a proper level that is suited to the transistors of the memory cells that are the major portion of the semiconductor memory device and are likely to yield the initial failure.

However, in a DRAM device of the word-line negative reset type wherein a non-selected word line is reset to a negative voltage, it is difficult to set, when performing the screening test, the internally produced voltage to the level suited to the transistors of the memory cells. A description will now be provided of the problem concerning the DRAM device of the word-line negative reset type with reference to FIG. 1.

FIG. 1 shows a portion of the DRAM device of the word-line negative reset type which includes a memory cell provided adjacent to a word line. As shown in FIG. 1, the memory cell includes a cell transistor 10 and a cell capacitor 11. The cell transistor 10 has a gate connected to the word line "WL". The cell capacitor 11 is connected to the bit line "BL" through the cell transistor 10. A predetermined voltage "VCP" is supplied to one end of the cell capacitor 11.

The predetermined voltage "VCP" may be set so that it is equal to either a ground voltage "VSS" or an internally produced voltage "(VCC–VSS)/2". In the following, suppose that the predetermined voltage "VCP" is equal to the ground voltage "VSS" (VCP=VSS).

In the memory cell in FIG. 1, a driver circuit, which is formed by a CMOS (complementary metal oxide semiconductor) inverter including a p-channel MOS transistor 12 (which is called the PMOS transistor 12) and an n-channel MOS transistor 13 (which is called the NMOS transistor 13), is connected to the word line WL. The driver circuit has an input connected to a word decoder (not shown in FIG. 1).

A raised voltage VPP is internally produced in the DRAM device from an external power-source voltage, and the raised voltage VPP is supplied to the source of the PMOS transistor 12. Further, a negative voltage VNWL is internally produced in the DRAM device, and the negative voltage VNWL is supplied to the source of the NMOS transistor 13.

During the operation of the DRAM device in the normal mode, when the memory cell 10 is selected (or when the word line WL is selected), the selected word line WL is set to the raised voltage VPP. When the memory cell 10 is not selected (or when the word line WL is not selected), the non-selected word line WL is set to the negative voltage VNWL. In other words, the voltage of the word line WL is switched between the raised voltage VPP and the negative voltage VNWL. When the voltage of the word line WL is at the raised voltage VPP, the gate-to-source voltage of the NMOS transistor 13 is set to the level (VPP–VNWL). When the voltage of the word line WL is at the negative voltage VNWL, the gate-to-source voltage of the PMOS transistor 12 is set to the level (VPP–VNWL). The back bias of the PMOS transistor 12 is set to the raised voltage VPP. The back bias of the NMOS transistor 13 is set to the negative voltage VNWL.

The gate-to-source voltage (or the gate-to-drain voltage) of the cell transistor 10 is set to the level (VPP–VSS). The back bias of the cell transistor 10 is set to the ground voltage VSS.

In the DRAM device of the above type, the gate-to-source voltage of the NMOS transistor 13 or the gate-to-source voltage of the PMOS transistor 12 is set to the level (VPP–VNWL), while the gate-to-source voltage of the cell transistor 10 is set to the level (VPP–VSS). Hence, the voltage stress exerted on the PMOS transistor 12 or the NMOS transistor 13 is higher than the voltage stress exerted on the cell transistor 10 by the difference (VSS–VNWL). Such unbalanced voltage stress, which is present at the CMOS inverter, is similarly exerted onto the neighboring circuit of the cell transistor 10 connected to the word line WL, such as the word decoder.

Also when the screening test is performed, the voltage stress exerted on the CMOS inverter or the neighboring circuit of the cell transistor (e.g., the word decoder) is higher than the voltage stress exerted on the cell transistor 10. In such conditions, it is difficult for the DRAM device of the above type to set, when performing the screening test, the internally produced voltage to the level suited to the transistors of the DRAM device. Ordinarily, the time needed to finish the screening test with respect to the DRAM device of the above type becomes long, and the cost becomes high. In order to eliminate this problem, if the voltage stress exerted on the cell transistor 10 is increased to allow speedy performance of the screening test, the voltage stress exerted on the CMOS inverter or the word decoder becomes excessively high and a breakdown of the DRAM device element may occur during the screening test.

As described above, the DRAM device of the word-line negative reset type has the problem in that the voltage stress exerted on the CMOS inverter or the word decoder is different from the voltage stress exerted on the cell transistor. Therefore, it is difficult to efficiently perform the screening test by exerting the same voltage stress on all the elements of the DRAM device of the word-line negative reset type.

SUMMARY OF THE INVENTION

An object of the present invention is to provide an improved semiconductor device in which the above-described problems are eliminated.

Another object of the present invention is to provide a semiconductor device which is configured to exert the same voltage stress on the elements of the semiconductor device when performing the screening test, in order to efficiently carry out the screening test.

The above-mentioned objects of the present invention are achieved by a semiconductor device comprising: a voltage generator which sets a voltage of a non-selected word line to a negative voltage when the semiconductor device is set in a normal mode; and a circuit which resets the voltage of the non-selected word line to a ground voltage when the semiconductor device is set in a predetermined mode.

The above-mentioned objects of the present invention are achieved by a semiconductor device in which a voltage of a non-selected word line is set at a first negative voltage, the semiconductor device comprising: a first circuit which resets the voltage of the non-selected word line to a ground voltage when the semiconductor device is set in a first mode; and a second circuit which sets the voltage of the non-selected word line at a second negative voltage different from the first negative voltage when the semiconductor device is set in a second mode.

The semiconductor device of the present invention makes it possible to exert the same voltage stress on the elements of the semiconductor device when performing the screening test. The semiconductor device of the present invention can efficiently carry out the screening test, and it is possible to reduce the time needed to finish the screening test.

BRIEF DESCRIPTION OF THE DRAWING

Other objects, features and advantages of the present invention will become apparent from the following detailed description when read in conjunction with the accompanying drawings.

FIG. 7 is a block diagram of the entire semiconductor device in which one preferred embodiment of the invention is incorporated.

DETAILED DESCRIPTION OF PREFERRED EMBODIMENTS

A description will now be provided of the preferred embodiments of the present invention with reference to the accompanying drawings.

Figure 1:
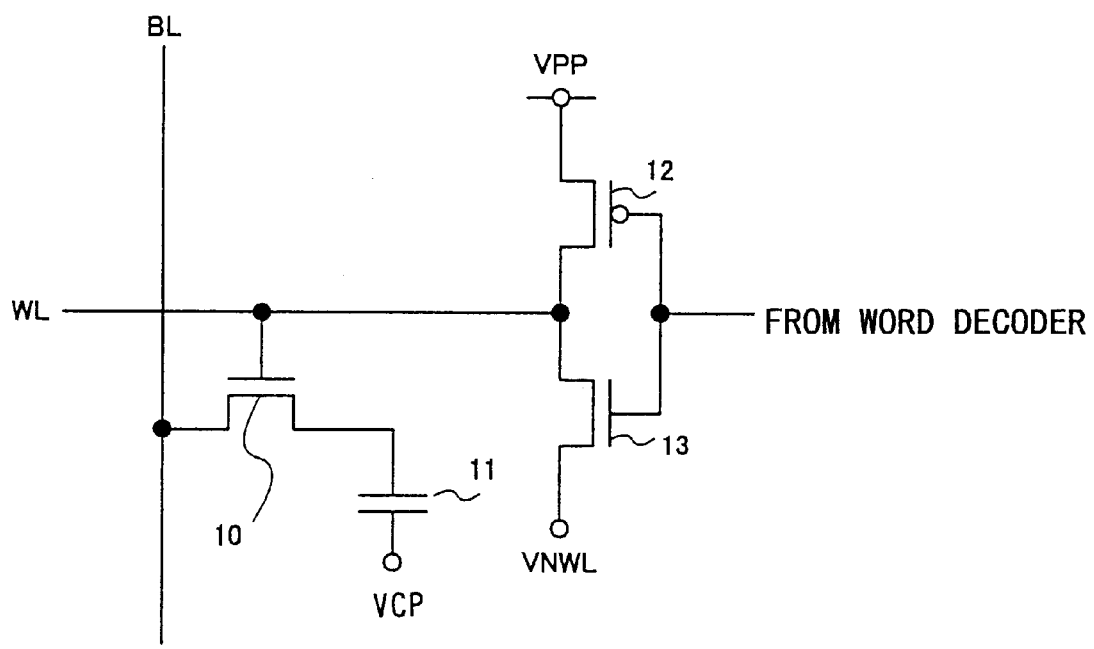
FIG. 1 is a circuit diagram of a portion of a DRAM of the word-line negative reset type which includes a memory cell provided adjacent to a word line.
Figure 2:
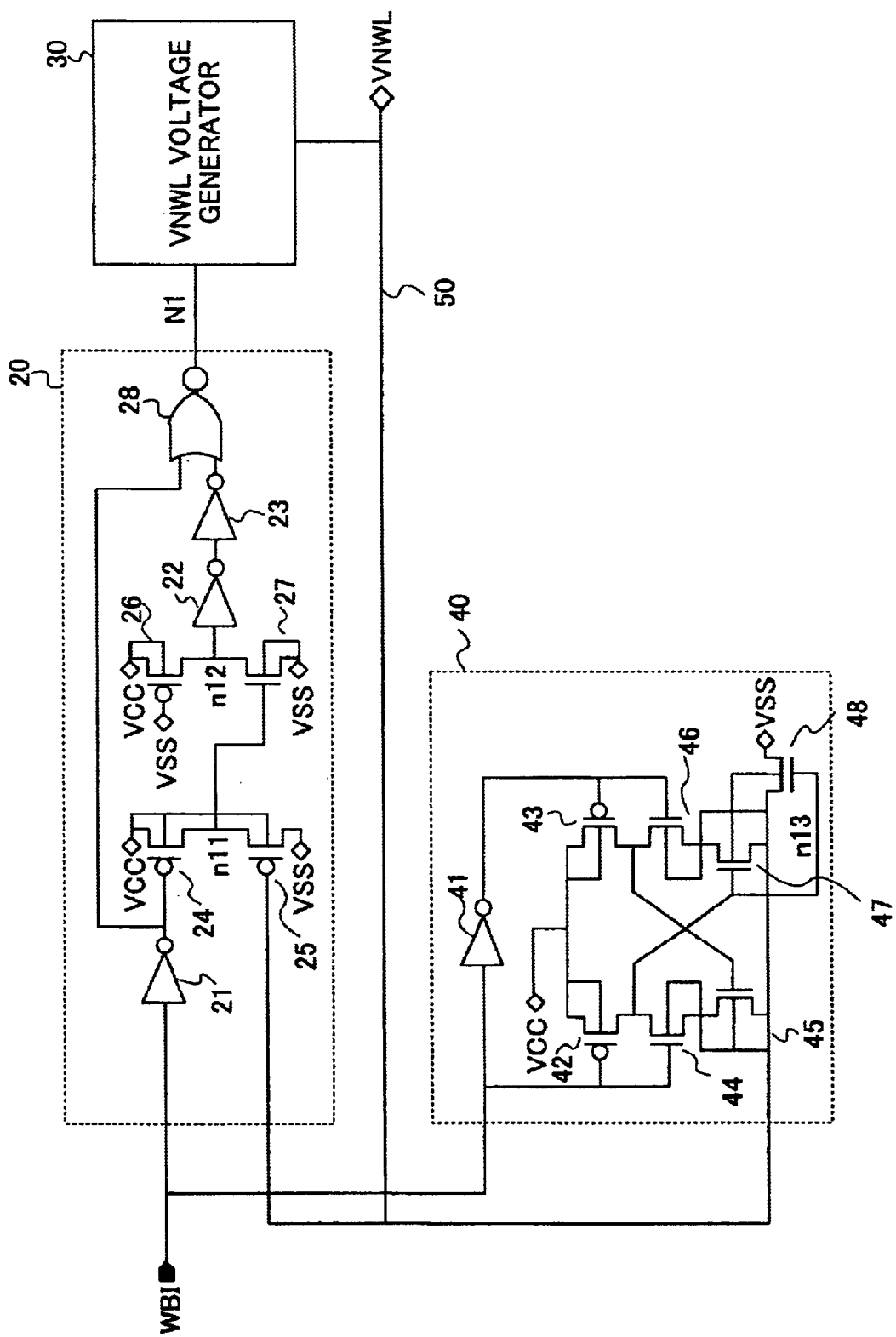
FIG. 2 is a circuit diagram of a main part of a first preferred embodiment of the semiconductor device of the invention.

FIG. 2 shows a main part of a first preferred embodiment of the semiconductor device of the invention. A word-line voltage controller 40 in this embodiment acts to reset the voltage of a non-selected word line WL of the DRAM in FIG. 1 to the ground voltage VSS.

As shown in FIG. 2, the semiconductor device of the present embodiment generally includes a VNWL voltage detector 20, a VNWL voltage generator 30 and a VNWL voltage controller 40.

The VNWL voltage generator 30 produces a negative voltage VNWL and supplies the negative voltage VNWL to a VNWL line 50. When a mode select signal WBI, which is input to the VNWL voltage detector 20, is at the high level, the VNWL voltage detector 20 is set in an enable state (ON). The VNWL voltage detector 20, when it is set in the enable state, outputs a control signal N1 to the VNWL voltage generator 30 such that the negative voltage VNWL generated by the VNWL voltage generator 30 is set to a controlled voltage. The control signal N1 is set in one of ON state (the VCC level) and OFF state (the VSS level) in response to the level of the mode select signal WBI, which will be described below.

When the mode select signal WBI is at the low level, the VNWL voltage detector 20 is set in a disable state (OFF), and the control operation of the voltage detector 20 to control the negative voltage VNWL of the VNWL voltage generator 30 is stopped. When the mode select signal WBI is at the high level, the DRAM device is set in a normal mode. On the other hand, when the mode select signal WBI is at the low level, the DRAM device is set in a predetermined mode (or a screening test mode). The mode select signal WBI may be externally supplied from an external terminal of the DRAM device to the VNWL voltage detector 20. Alternatively, an externally supplied command signal may be decoded within the DRAM device so as to produce the mode select signal WBI being supplied to the VNWL voltage detector 20.

When the mode select signal WBI, which is input also to the VNWL voltage controller 40, is at the high level, the VNWL voltage controller 40 is set in a disable state, and the control operation of the controller 40 to control the voltage of the VNWL line 50 is stopped. When the mode select signal WBI is at the low level, the VNWL voltage controller 40 is set in an enable state, and the VNWL voltage controller 40 resets the voltage of the VNWL line 50 to the ground voltage VSS. In other words, the VNWL voltage controller 40 short-circuits the VNWL line 50 to the ground voltage VSS.

The VNWL line 50 is connected through the word decoder (not shown in FIG. 2) to the gate of the CMOS inverter related to the memory cell in FIG. 1 and the source of the NMOS transistor 13 related to the memory cell in FIG. 1. When the DRAM device is set in the screening test mode, the VNWL voltage controller 40 resets the voltage of a non-selected word line WL in the DRAM device to the ground voltage VSS through the connection of the VNWL line 50 to the DRAM device.

Similarly, the VNWL line 50 is connected through the word decoder to the gates of CMOS inverters related to other memory cells of the DRAM device and the sources of NMOS transistors 13 related to the other memory cells. Further, the VNWL line 50 is connected to other neighboring circuits of the DRAM device to which the negative voltage NVWL is supplied, similar to the word decoder.

When the mode select signal WBI is at the high level (the normal mode), the VNWL voltage detector 20 controls the VNWL voltage generator 30 such that the negative voltage VNWL generated by the VNWL voltage generator 30 is set to the controlled voltage. At this time, the VNWL voltage controller 40 is set in the disable state, and it does not act to control the voltage of the VNWL line 50. In the normal mode, the DRAM device is actually used to access the information in the DRAM memory.

On the other hand, when the mode select signal WBI is at the low level (the screening test mode), the VNWL voltage detector 20 is set in the disable state, and it does not act to control the VNWL voltage generator 30. At this time, the VNWL voltage controller 40 resets the voltage of the VNWL line 50 to the ground voltage VSS. As the VNWL line 50 is connected to the word line WL through the CMOS inverter in FIG. 1, the VNWL voltage controller 40 acts to reset the voltage of the word line WL to the ground voltage VSS. When the screening test is performed, both the voltage stress on the PMOS transistor 12 and the voltage stress on the NMOS transistor 13 are equal to the level (VPP−VSS). This voltage stress is the same as the voltage stress on the cell transistor 10 in FIG. 1. Accordingly, the semiconductor device of the present embodiment makes it possible to exert the same voltage stress on the elements of the semiconductor device when performing the screening test. The semiconductor device of the present embodiment can efficiently carry out the screening test, and it is possible to reduce the time needed to finish the screening test.

Next, a description will be given of the respective elements of the semiconductor device of the present embodiment.

As shown in FIG. 2, the VNWL voltage detector 20 includes inverters 21, 22 and 23, PMOS transistors 24, 25 and 26, an NMOS transistor 27, and an NOR gate 28. The mode select signal WBI is input to the inverter 21. The VNWL line 50 is connected to the gate of the PMOS transistor 25. When the mode select signal WBI is at the high level, the PMOS transistor 24 is set in ON state. The ON resistance of the PMOS transistor 25 varies depending on the level of the negative voltage VNWL supplied to the gate of the PMOS transistor 25, and the potential of the node "n11" is determined. The potential of the node "n11" is supplied to the gate of the NMOS transistor 27. The PMOS transistor 26 has a gate connected to the ground voltage VSS. The PMOS transistor 26 and the NMOS transistor 27 form a CMOS inverter. The transition level at which the state of the CMOS inverter (including the transistors 26 and 27) is switched varies depending on the potential of the node "n11". Namely, the potential of the node "n12" related to the CMOS inverter depends on the potential of the node "n11". The potential of the node "n12" is supplied through the inverters 22 and 23 to one of two inputs of the NOR gate 28. The low-level voltage at the output of the inverter 21 is supplied to the other input of the NOR gate 28. When the output of the inverter 23 is at the low level, the control signal N1 at the output of the NOR gate 28 is set at the high level. When the output of the inverter 23 is at the high level, the control signal n1 is set at the low level. The VNWL voltage generator 30 outputs the negative voltage VNWL in response to the level of the control signal N1 received from the VNWL voltage detector 20.

When the mode select signal WBI is at the low level, the NOR gate 28 is placed in the closed condition, and the VNWL voltage detector 20 is set in the disable state. The control signal N1 at the output of the NOR gate 28 is fixed to, for example, the low level. The VNWL voltage generator 30 may be constituted by using any conventional voltage generator.

Further, as shown in FIG. 2, the VNWL voltage controller 40 includes an inverter 41, PMOS transistors 42 and 43, and NMOS transistors 44, 45, 46, 47 and 48. When the mode select signal WBI is at the high level, the NMOS transistors 44 and 45 are set in ON state, and the negative voltage VNWL is supplied to the gate of each of the NMOS transistors 47 and 48 The VNWL voltage controller 40 at this time is set in the disable state (OFF state). The VNWL voltage controller 40 does not act to control the voltage of the VNWL line 50. In other words, the negative voltage VNWL generated by the VNWL voltage generator 30 is not controlled by the VNWL voltage controller 40.

When the mode select signal WBI is at the low level, the power-source voltage VCC is supplied through the PMOS transistor 42 to both the NMOS transistor 47 and the NMOS transistor 48. The VNWL line 50 is short-circuited to the ground voltage VSS via the NMOS transistor 48, and the VNWL voltage controller 40 acts to set the voltage of the VNWL line 50 to the ground voltage VSS.

Figure 3:
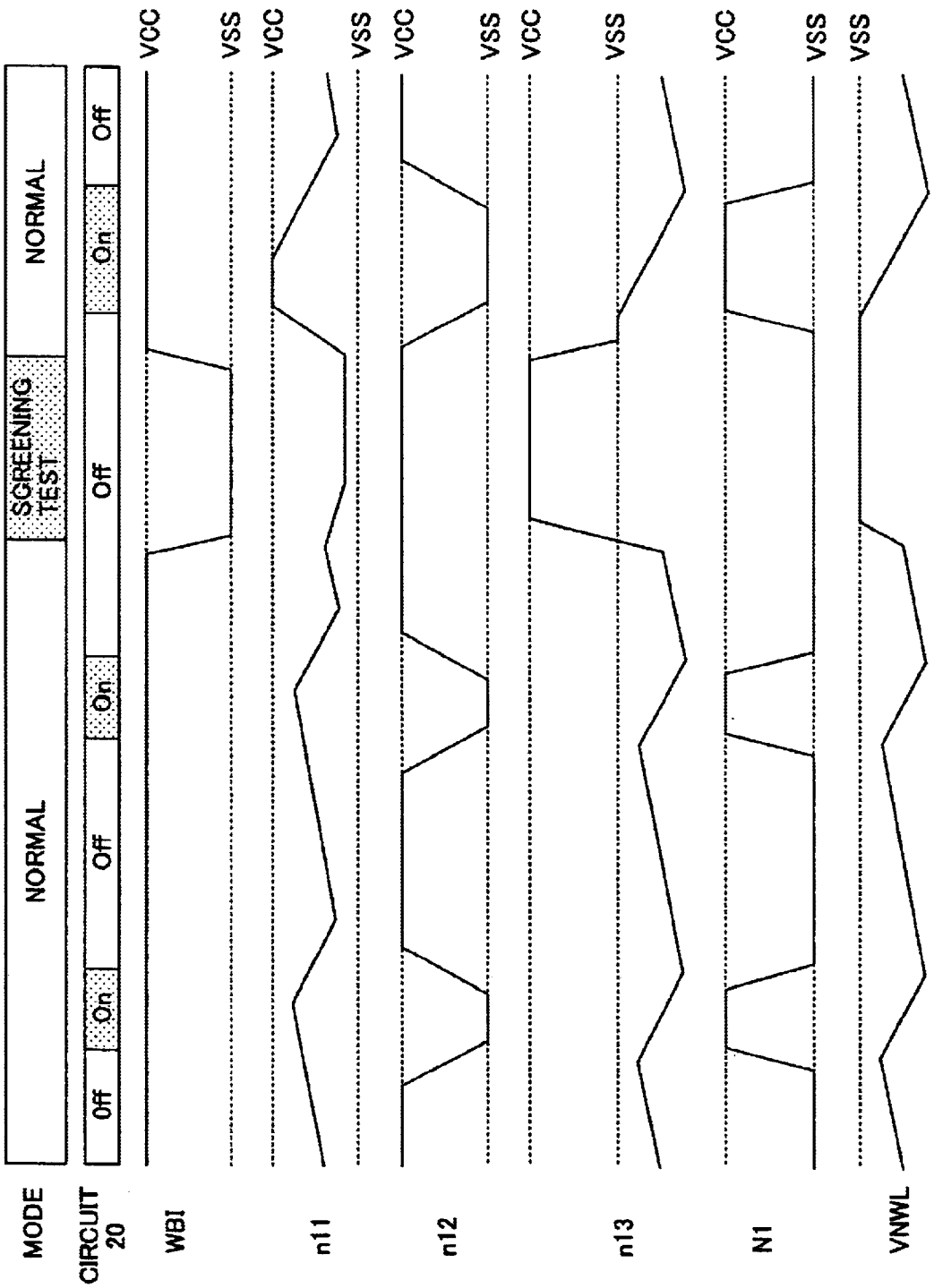
FIG. 3 is a signal waveform for explaining operation of the semiconductor device in FIG. 2.

FIG. 3 is a signal waveform diagram for explaining operation of the semiconductor device in FIG. 2.

As shown in FIG. 3, when the mode select signal WBI is at the high level so that the DRAM device is set in the normal mode, the potential of the node "n11" is increased in accordance with the increase of the negative voltage VNWL. This is because the ON resistance of the PMOS transistor 25 is gradually increased. When the potential of the node "n11" reaches the transition level of the CMOS inverter (including the transistors 26 and 27), the state of the CMOS inverter is switched. At this time, the potential of the node "n12" is changed from the power-source voltage VCC to the ground voltage VSS. By this change of the potential of the node "n12", the level of the control signal N1 is changed from the ground voltage VSS (OFF state) to the power-source voltage VCC (ON state). When the control signal N1 is held at the ground voltage VSS, the negative voltage VNWL produced by the VNWL voltage generator 30 is gradually increased toward the ground voltage VSS. When the control signal N1 is at the power-source voltage VCC, the negative voltage VNWL produced by the VNWL voltage generator 30 is gradually decreased such that the absolute value of the negative voltage VNWL is increased. The potential of the node "n11" is decreased in accordance with the decrease of the negative voltage VNWL. When the potential of the node "n11" reaches the transition level of the CMOS inverter (the transistors 26 and 27), the state of the CMOS inverter is switched. At this time, the potential of the node "n12" is changed from the ground voltage VSS to the power-source voltage VCC. Further, the above procedure is repeated subsequently during the normal mode of the DRAM device.

As shown in FIG. 3, when the mode select signal WBI is changed from the high level to the low level so that the DRAM device is set in the screening test mode, the power-source voltage VCC is supplied to the node "n13" and the NMOS transistor 48 is set in ON state. The voltage of the VNWL line 50 is reset to the ground voltage VSS by the VNWL voltage controller 40. When the mode select signal WBI is changed from the low level to the high level, the potential of the node "n13" is changed to the ground voltage VSS. After it is held at the ground voltage VSS, the potential of the node "n13" is further decreased in accordance with the decrease of the negative voltage VNWL.

Figure 4:
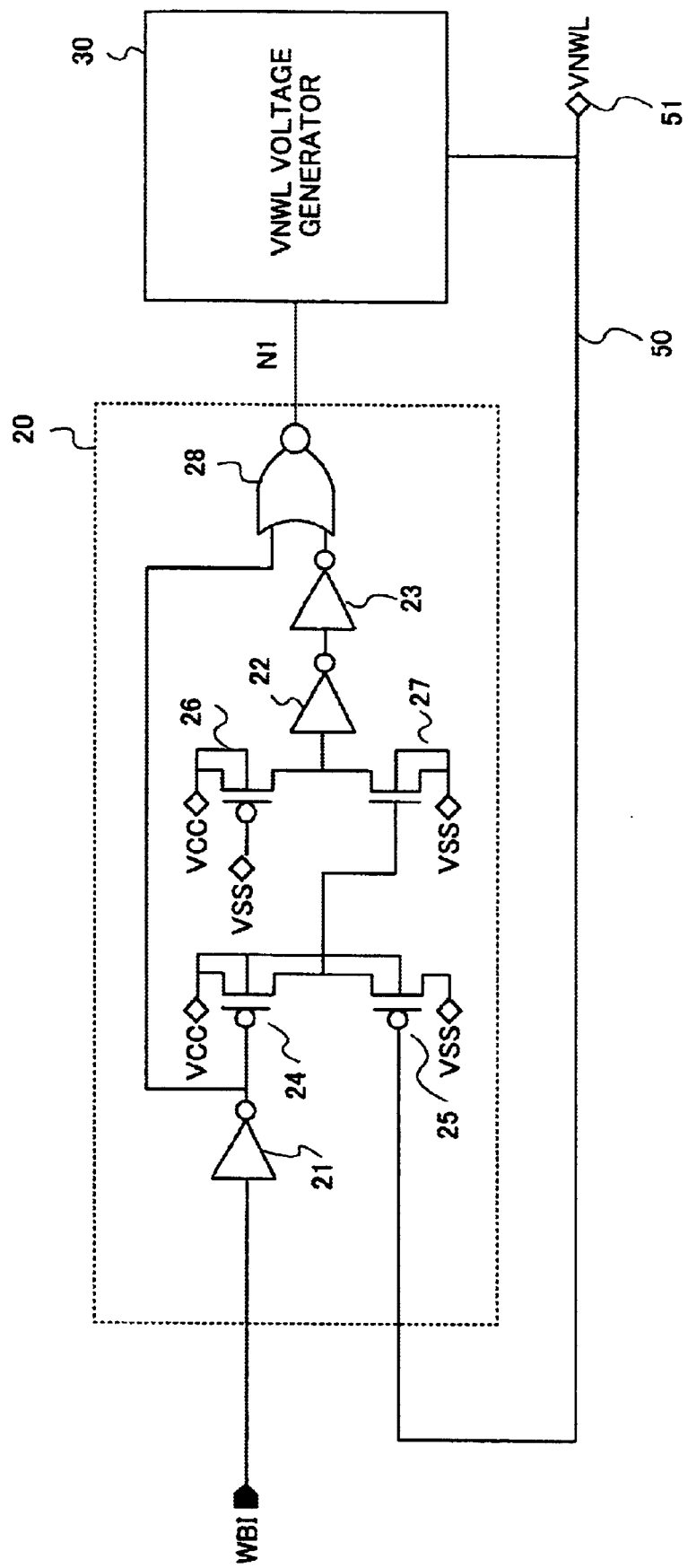
FIG. 4 is a circuit diagram of a main part of a second preferred embodiment of the semiconductor device of the invention.

Next, FIG. 4 shows a main part of a second preferred embodiment of the semiconductor device of the invention. In FIG. 4, the elements that are essentially the same as corresponding elements in FIG. 2 are designated by the same reference numerals, and a description thereof will be omitted.

As shown in FIG. 4, in the semiconductor device of the present embodiment, the VNWL voltage controller 40 as in the previous embodiment of FIG. 2 is eliminated, and a terminal 51 is connected to the end of the VNWL line 50 for connection with an external circuit (not shown). In the present embodiment, when the semiconductor device is set in the predetermined mode, such as the screening test mode, the terminal 51 at which the external circuit is connected to the VNWL line 50 acts to reset the voltage of the non-selected word line WL to the ground voltage VSS.

In the previous embodiment of FIG. 2, the VNWL voltage controller 40 is provided inside the DRAM device to reset the voltage of the non-selected word line WL to the ground voltage VSS when the screening test is performed. In the semiconductor device of FIG. 4, when the mode select signal WBI is at the low level (the screening test mode), the ground voltage VSS from the external circuit is supplied to the VNWL line 50 via the terminal 51, so that the terminal 51 performs the same function as that of the VNWL voltage controller 40.

Figure 5:
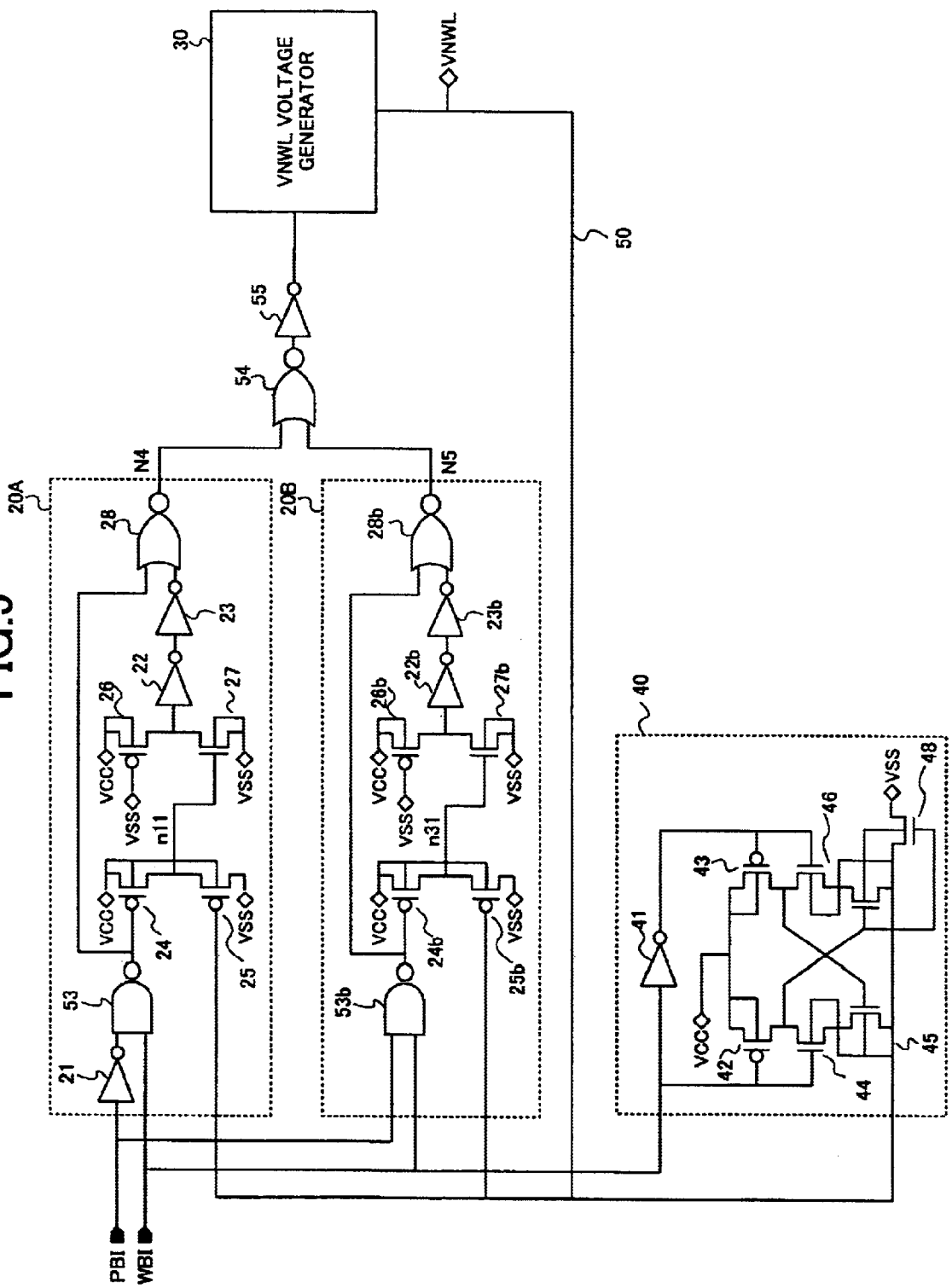
FIG. 5 is a circuit diagram of a main part of a third preferred embodiment of the semiconductor device of the invention.

Next, FIG. 5 shows a main part of a third preferred embodiment of the semiconductor device of the invention. In FIG. 5, the elements that are essentially the same as corresponding elements in FIG. 2 are designated by the same reference numerals, and a description thereof will be omitted.

In the present embodiment, the semiconductor device generally includes a VNWL voltage controller 40, a first VNWL voltage detector 20A, a second VNWL voltage detector 20B, and the VNWL voltage generator 30. When the semiconductor device is set in a first mode, the VNWL voltage controller 40 acts to reset the voltage of a non-selected word line WL to the ground voltage VSS. When the semiconductor device is set in a second mode, the second VNWL detector 20B controls the VNWL voltage generator 30 such that the negative voltage VNWL is set to a second controlled voltage that is different from a first controlled voltage which the first VNWL voltage detector 20A acts to set the negative voltage VNWL to. The first VNWL detector 20A controls the VNWL voltage generator 30 such that the negative voltage VNWL is set to the first controlled voltage.

The first mode is, for example, a screening test mode which is used when performing the screening test for the semiconductor device before the packaging process thereof (which will be called a first screening test mode). The second mode is, for example, a screening test mode which is used when performing the screening test for the semiconductor device after the packaging process thereof (which will be called a second screening test mode).

The first VNWL voltage detector 20A and the second VNWL voltage detector 20B act to set the negative voltage VNWL, produced by the VNWL voltage generator 30, to the first controlled voltage and the second controlled voltage, respectively. For example, the absolute value of the first controlled voltage to which the first VNWL voltage detector 20A acts to set the negative voltage VNWL is larger than the absolute value of the second controlled voltage related to the second VNWL voltage detector 20B. The second controlled voltage is nearer to the ground voltage VSS than the first controlled voltage. In other words, the difference between the ground voltage VSS and the first controlled voltage is larger than the difference between the ground voltage VSS and the second controlled voltage.

When the semiconductor device is set in the first screening test mode (which is used before the packaging process), both the first VNWL voltage detector 20A and the second VNWL voltage detector 20B are set in the disable state, and only the VNWL voltage controller 40 is set in the enable state. The voltage of the non-selected word line WL is reset to the ground voltage VSS by the VNWL voltage controller 40. At this time, both the detectors 20A and 20B do not act to control the negative voltage VNWL.

When the semiconductor device is set in the second screening test mode (which is used after the packaging process), both the first VNWL voltage detector 20A and the VNWL voltage controller 40 are set in the disable state, and only the second VNWL voltage detector 20B is set in the enable state. The second VNWL voltage detector 20B acts to set the voltage of the non-selected word line WL to the negative voltage VNWL that is set to the second controlled voltage nearer to the ground voltage VSS than the first controlled voltage related to the first VNWL voltage detector 20A. When performing the screening test for the semiconductor device after the packaging process, the second VNWL voltage detector 20B makes it possible to set the voltage of the non-selected word line WL to the relatively weak, negative voltage VNWL (or the second controlled voltage nearer to the ground voltage VSS). Hence, it is possible for the present embodiment to exert a reduced voltage stress on the cell transistors 10 of the semiconductor device when performing the screening test after the packaging process, in order to avoid breakdown of the cell transistors 10.

In the semiconductor device in FIG. 5, an additional mode select signal "PBI" is used in addition to the mode select signal "WBI" described above. Both the mode select signal "WBI" and the mode select signal "PBI" are input to each of the detectors 20A and 20B and the controller 40. By setting the mode select signals "WBI" and "PBI" appropriately, the semiconductor device can be set in a selected one of the normal mode, the first screening test mode and the second screening test mode. Specifically, in the present embodiment: when both the signals "WBI" and "PBI" are at the high level, the normal mode is selected; when the signal "WBI" is at the low level and the signal "PBI" is at the high level, the first screening test mode is selected; and when the signal "WBI" is at the high level and the signal "PBI" is at the low level, the second screening test mode is selected.

As shown in FIG. 5, the first VNWL voltage detector 20A is provided so as to have an NAND gate 53 inserted in the VNWL voltage detector 20 as in the previous embodiment of FIG. 2. Other elements of the first VNWL voltage detector 20A are essentially the same as corresponding elements of the VNWL voltage detector 20, and a description thereof will be omitted. The second VNWL voltage detector 20B is provided so as to remove the inverter 21 as in the first VNWL voltage detector 20A.

The second VNWL voltage detector 20B includes inverters 22b and 23b, PMOS transistors 24b, 25b and 26b, an NMOS transistor 27b, an NOR gate 28b, and an NAND gate 53b. When the same negative voltage VNWL on the VNWL line 50 is supplied to both the gate of the PMOS transistor 25 and the gate of the PMOS transistor 25b, the potential of the node "n11" where the PMOS transistor 24 and 25 are connected in series and the potential of the node "n31" where the PMOS transistors 24b and 25b are connected in series are different from each other. Specifically, in the present embodiment, the first VNWL voltage detector 20A and the second VNWL voltage detector 20B are configured such that the potential of the node "n31" is lower than the potential of the node "n11". The above-mentioned configuration is achieved by using the PMOS transistors 24 and 25 with a first size and the PMOS transistors 24b and 25b with a second size, the first size and the second size being different from each other.

When both the mode select signals WBI and PBI are at the high level, the first VNWL voltage detector 20A is set in ON state and the second VNWL voltage detector 20B is set in OFF state. When the signal WBI is at the low level and the signal PBI is at the high level, both the first and second VNWL voltage detectors 20A and 20B are set in OFF state. When the signal WBI is at the high level and the signal PBI is at the low level, the first VNWL voltage detector 20A is set in OFF state and the second VNWL voltage detector 20B is set in ON state.

An NOR circuit 54 is provided at the outputs of the first and second VNWL voltage detectors 20A and 20B, and this NOR circuit 54 produces at its output an NOR logic level of a control signal "N4" output by the first VNWL voltage detector 20A and a control signal "N5" output by the second VNWL voltage detector 20B. The output of the NOR circuit 54 is connected to an input of an inverter 55. Hence, the output signal of the NOR circuit 54 is supplied to the VNWL voltage generator 30 via the inverter 55.

In the present embodiment, the semiconductor device is provided with the second screening test mode in addition to the first screening test mode. The semiconductor device of the present embodiment makes it possible to exert an appropriate voltage stress on the elements of the semiconductor device when performing the screening test not only before the packaging process but also after the packaging process. It is possible to increase the reliability of the screening test.

Figure 6:
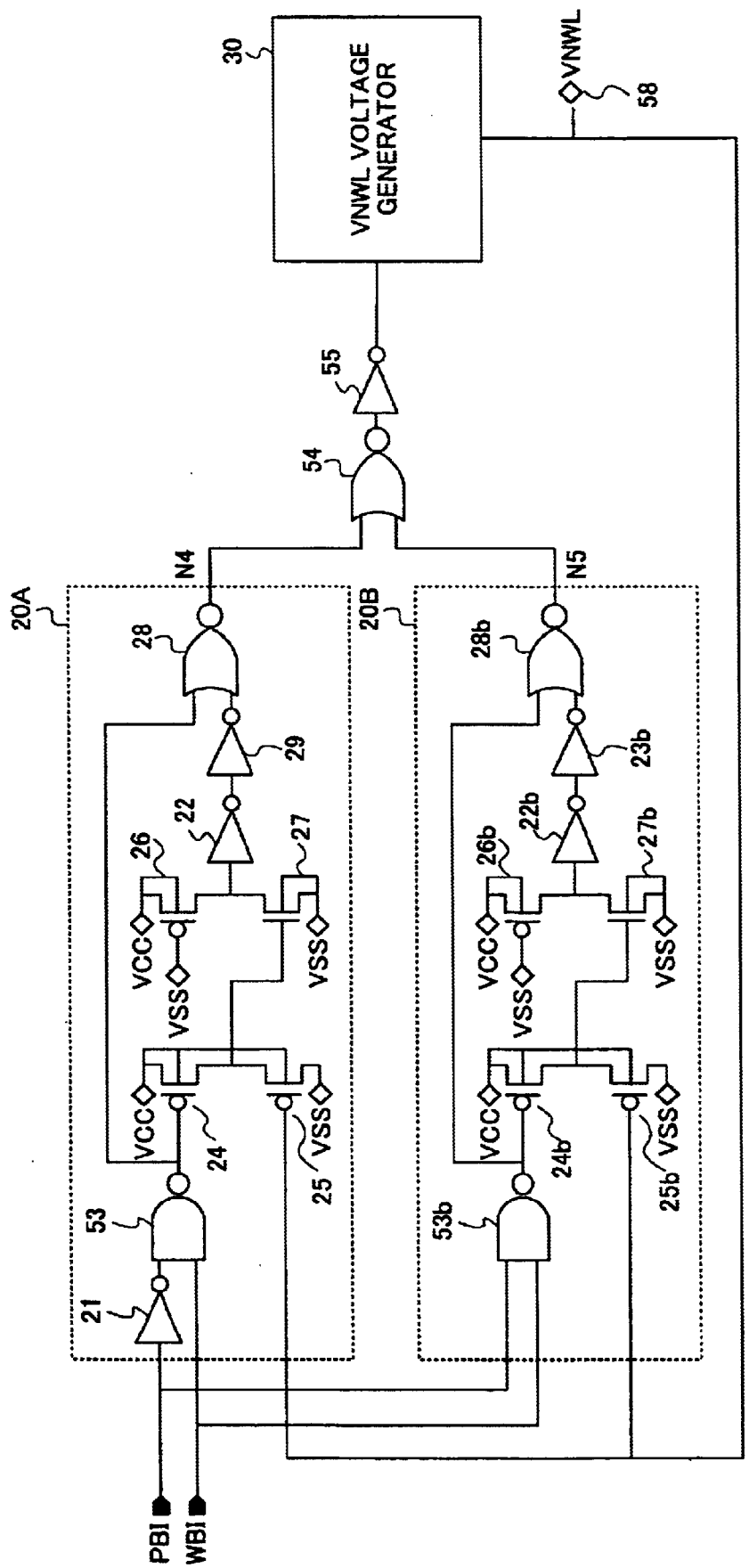
FIG. 6 is a circuit diagram of a main part of a fourth preferred embodiment of the semiconductor device of the invention.

Next, FIG. 6 shows a main part of a fourth preferred embodiment of the semiconductor device of the invention. In FIG. 6, the elements that are essentially the same as corresponding elements in FIG. 5 are designated by the same reference numerals, and a description thereof will be omitted.

As shown in FIG. 6, in the semiconductor device of the present embodiment, the VNWL voltage controller 40 as in the previous embodiment of FIG. 5 is eliminated, and a terminal 58 is connected to the end of the VNWL line 50 for connection with an external circuit (not shown). In the present embodiment, when the semiconductor device is set in the predetermined mode, such as the first or second screening test mode, the terminal 58 at which the external circuit is connected to the VNWL line 50 acts to reset the non-selected word line WL to the ground voltage VSS.

In the previous embodiment of FIG. 5, the VNWL voltage controller 40 is provided inside the DRAM device to reset the voltage of the non-selected word line WL to the ground voltage VSS when the screening test is performed. In the semiconductor device of FIG. 6, when the semiconductor device is set in the first or second screening test mode, the ground voltage VSS from the external circuit is supplied to the VNWL line 50 via the terminal 58, so that the terminal 58 performs the same function as that of the VNWL voltage controller 40.

FIG. 7 shows the entire semiconductor device in which one embodiment of the present invention or its variation, or a circuit setting the voltage of a non-selected word line to the ground voltage in the predetermined mode, such as the screening test mode, is incorporated.

The semiconductor device in FIG. 7 generally includes a negative voltage generator 61, a raised voltage generator 62, a word decoder 63, a DRAM cell array 64, a column decoder 65, an I/O circuit 66, a control circuit 67, a raised voltage detector 68, a negative voltage detector 69, and a base/plate voltage generator 70. The negative voltage generator 61 is essentially the same as the above-described VNWL voltage generator 30. The negative voltage detector 69 is essentially the same as any of the above-described VNWL voltage detectors 20, 20A and 20B.

As shown in FIG. 7, the control circuit 67 receives at its inputs the externally supplied address and control signals and the mode select signal WBI (and PBI), and produces control signals at its outputs to the respective elements of the semiconductor device based on the received signals. In the control circuit 67, the above-described VNWL voltage controller 40 is provided therein. Specifically, the control circuit 67 receives the mode select signal WBI (and PBI), and outputs the control signal N1 (or N4 and N5) to the negative voltage detector 69. The control circuit 67 receives the mode select signal WBI (and PBI) and the externally supplied control signals, and outputs the respective control signals to the raised voltage detector 68, the base/plate voltage generator 70 and the I/O circuit 66. The raised voltage detector 68 controls the raised voltage generator 62 such that the raised voltage VPP, produced by the raised voltage generator 62, is set to a controlled voltage. The base/plate voltage generator 70 produces the base voltage of the DRAM device and produces the plate voltage, such as the ground voltage VSS, to be supplied to the plate electrodes of the cell capacitors 11. Moreover, the control circuit 67 receives the address signal and outputs the control signals to the word decoder 63 and the column decoder 65. The CMOS inverter (the transistors 12 and 13) shown in FIG. 1 is included in the word decoder 63.

In the above-described embodiments, the semiconductor device of the present invention is applied to the DRAM. However, the semiconductor device of the present invention is not limited to the DRAM. The present invention is also applicable to other semiconductor devices having memory areas.

The present invention is not limited to the above-described embodiments, and variations and modifications may be made without departing from the scope of the present invention.

Further, the present invention is based on Japanese priority application No. 2001-041823, filed on Feb. 19, 2001, the entire contents of which are hereby incorporated by reference.

What is claimed is:

1. A semiconductor device comprising:
    a voltage generator setting a voltage of a non-selected word line to a negative voltage when the semiconductor device is set in a normal mode; and
    a circuit resetting the voltage of the non-selected word line to a ground voltage when the semiconductor device is set in a predetermined mode.

2. The semiconductor device according to claim 1, wherein said circuit receives a signal specifying the predetermined mode, and resets the voltage of the non-selected word line to the ground voltage in response to the received signal.

3. The semiconductor device according to claim 1, wherein the semiconductor device includes a terminal at which one end of the word line is connected to an external circuit, and wherein, when the semiconductor device is set in the predetermined mode, the voltage of the non-selected word line is reset to the ground voltage by supplying the ground voltage to the non-selected word line via the terminal.

4. The semiconductor device according to claim 1, wherein said circuit is set in a disable state when the semiconductor device is set in the normal mode, and said circuit is set in an enable state, when the semiconductor device is set in the predetermined mode, so that the voltage of the non-selected word line is reset to the ground voltage by said circuit in the enable state.

5. The semiconductor device according to claim 1, wherein the semiconductor device includes a voltage detector which controls the negative voltage produced by the voltage generator in the normal mode, and a voltage controller which controls the voltage generator such that the negative voltage is set to a controlled voltage, wherein the voltage controller sets the voltage detector in a disable state in the predetermined mode.

6. The semiconductor device according to claim 1, wherein, when the semiconductor device is set in the predetermined mode, the semiconductor device is subjected to a screening test under conditions different from conditions in the normal mode.

7. A semiconductor device in which a voltage of a non-selected word line is set at a first negative voltage, comprising:

a first circuit resetting the voltage of the non-selected word line to a ground voltage when the semiconductor device is set in a first mode; and a second circuit setting the voltage of the non-selected word line at a second negative voltage different from the first negative voltage when the semiconductor device is set in a second mode.

8. The semiconductor device according to claim 7, wherein the second negative voltage is nearer to the ground voltage than the first negative voltage.

9. The semiconductor device according to claim 7, wherein the semiconductor device includes a voltage generator which produces a negative voltage, and the first circuit includes a terminal at which one end of the word line is connected to an external circuit, and wherein the second circuit controls the voltage generator in the second mode, such that the negative voltage produced by the voltage generator is set to the second negative voltage.

10. The semiconductor device according to claim 7, wherein, when the semiconductor device is set in one of the first mode and the second mode, the semiconductor device is subjected to a screening test under conditions different from conditions in the normal mode.

* * * * *